(12) United States Patent
Knapp

(10) Patent No.: US 6,573,852 B2
(45) Date of Patent: Jun. 3, 2003

(54) ANALOG-TO-DIGITAL CONVERSION SYSTEM

(75) Inventor: Benjamin P. Knapp, Byron Center, MI (US)

(73) Assignee: SPX Corporation, Charlotte, NC (US)

( * ) Notice: Subject to any disclaimer, the term of this patent is extended or adjusted under 35 U.S.C. 154(b) by 0 days.

(21) Appl. No.: 10/134,499

(22) Filed: Apr. 30, 2002

(65) Prior Publication Data

US 2002/0158788 A1 Oct. 31, 2002

Related U.S. Application Data

(60) Provisional application No. 60/287,627, filed on Apr. 30, 2001.

(51) Int. Cl.[7] .............................................. H03M 1/12
(52) U.S. Cl. ........................................ 341/155; 341/159
(58) Field of Search ................................ 341/159, 155, 341/156, 161

(56) References Cited

U.S. PATENT DOCUMENTS 5,841,389 A  * 11/1998  Kinugasa ..................... 341/159
6,414,621 B1 *  7/2002  Lee ............................. 341/159

* cited by examiner

Primary Examiner—Brian Young
(74) Attorney, Agent, or Firm—Baker & Hostetler LLP

(57) ABSTRACT

An analog-to-digital signal conversion system includes two analog-to-digital converters having equal inherent frequencies. The analog-to-digital converters share common input channels, and the output of each analog-to-digital converter is directed to a multiplexer that is arranged on a programmable logic device. The converters alternate in the sampling of analog signals, thus delivering digital signals to the multiplexer at a higher speed than either analog-to-digital converter could do on an individual basis. The multiplexer delivers the digital signals to slots of a memory mailbox, where the slots correspond to the input channels of each converter.

20 Claims, 2 Drawing Sheets

ANALOG-TO-DIGITAL CONVERSION SYSTEM

PRIORITY

This application claims priority to provisional U.S. Patent Application entitled, Analog-to-digital Conversation System, filed Apr. 30, 2001, having serial No. 60/287,627, the disclosure of which is incorporated herein by reference.

FIELD OF THE INVENTION

The present invention relates generally to analog-to-digital converters. More particularly, the present invention relates to an analog-to-digital conversion system that includes two analog-to-digital converters that operate together to alternatively receive analog signals from two or more input channels, and a programmable logic device.

BACKGROUND OF THE INVENTION

An analog-to-digital converter is a circuit, typically contained on a chip or programmable logic device, that converts an analog input signal into a digital output signal. Analog-to-digital converters have a wide variety of applications. For example, an analog-to-digital converter may be used in an engine analyzer system in order to convert analog input signals representative of engine operations, such as rotations per minute, voltage, amperage, and other data, into digital signals that may be used by a microprocessor, computer memory, and/or display device. By receiving an analog voltage signal as input, for example, an analog-to-digital converter may be utilized to convert the analog signal into a digital signal so that the voltage may be displayed in a digital format such as in numeric form.

The parallel analog-to-digital converter is the most common type of digital converter. A typical parallel analog-to-digital converter uses a comparator for each level of quantization. As higher speeds and higher numbers of input channels are required, additional comparators are required. Thus, one problem with the prior analog-to-digital converters is the difficulty of designing and providing a simple, low cost analog-to-digital converter capable of operating at high speeds.

Accordingly, it is desirable to provide an improved analog-to-digital conversion system that offers high-speed operation using a design that requires relatively low costs to manufacture the system.

SUMMARY OF THE INVENTION

It is therefore a feature and advantage of the present invention to provide an analog-to-digital conversion system that includes a plurality of A/D converters running at a clock speed which simulates an A/D converter running at a faster clock speed.

It is another feature and advantage of the present invention to provide an analog-to-digital conversion system that allows one to select inputs of interest to analyze.

The above and other features and advantages are achieved through the use of a novel analog-to-digital conversion system. In accordance with one embodiment of the present invention an analog-to-digital conversion system includes a plurality of analog-to-digital converters receiving inputs that are connected to one another so that each of the analog-to-digital converters receive each of the inputs. A scheduler in communication with the plurality of analog-to-digital converters is provided. The scheduler selects which of the inputs to transmit. A memory is also provided which includes a plurality of memory locations. The scheduler associates each of the inputs to a memory location and transmits the selected input to the associated memory location.

In accordance with another embodiment of the present invention, an analog-to-digital conversion method includes the steps of selecting one or more inputs from multiple inputs; associating each of the one or more inputs with a corresponding memory location; transmitting each of the one or more inputs to multiple analog-to-digital converters; converting each of the one or more inputs into a digital signal with each of the multiple analog-to-digital converters; and storing each of the digital signals into the corresponding memory location.

In accordance with another embodiment of the present invention, an analog-to-digital conversion system includes a selecting means for selecting one or more inputs from multiple inputs and an associating means for associating each of the one or more inputs with a corresponding memory location. A transmitting means is provided for transmitting each of the one or more inputs to multiple analog-to-digital converters. A converting means is provided for converting each of the one or more inputs into a digital signal with each of the multiple analog-to-digital converters, and a storing means is provided for storing each of the digital signals into the corresponding memory location.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

It is therefore a feature and advantage of the present invention to provide an improved analog-to-digital conversion system.

Figure 1:
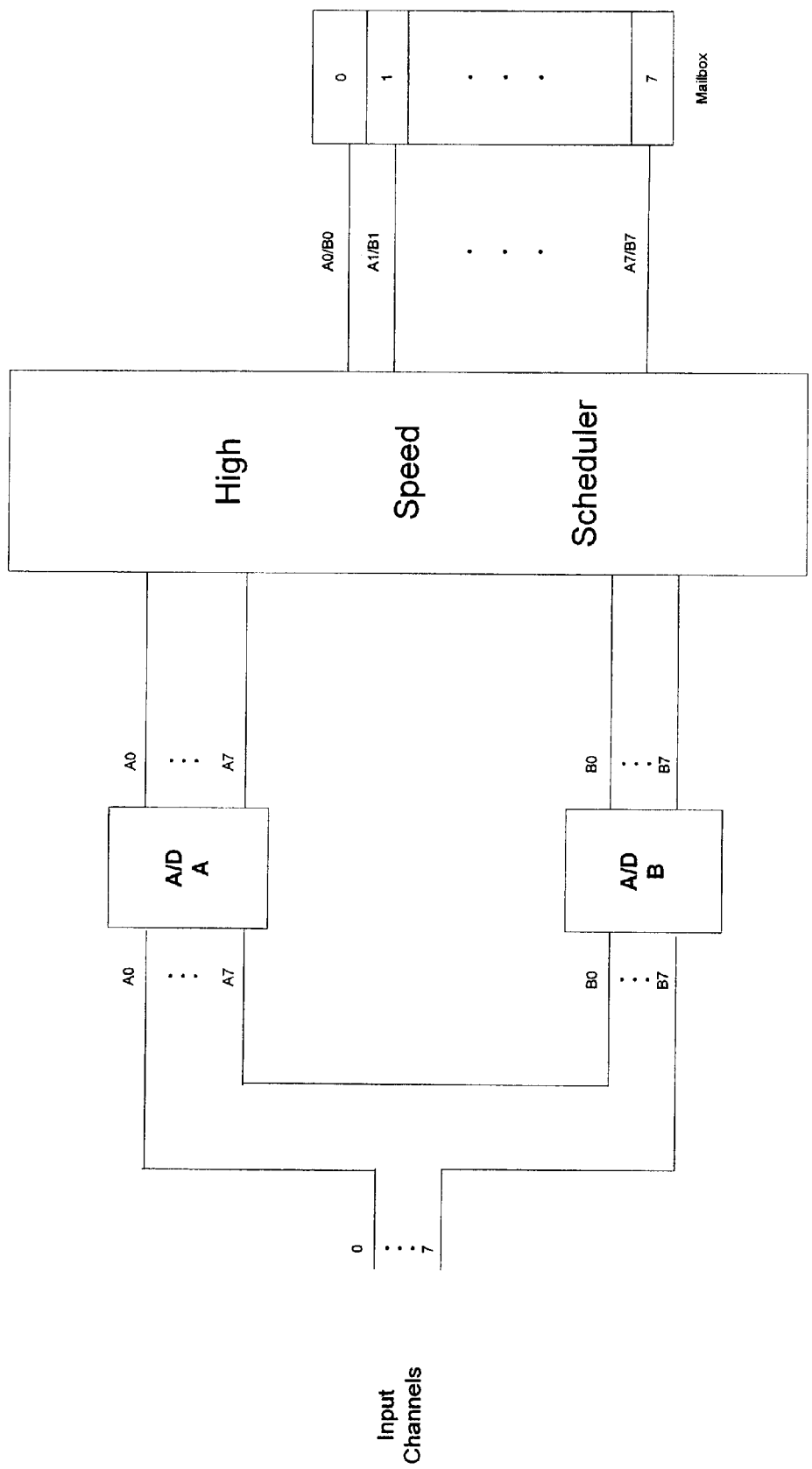
FIG. 1 is a block diagram of an analog-to-digital conversion system of the present invention.

FIG. 1 is a block diagram of an analog-to-digital conversion system of the present invention. The analog-to-digital conversion system includes two analog-to-digital (A/D)

converters, A/D A and A/D B. Each of the A/D converters, A/D A and A/D B, has 8 input channels, A0 to A7 and B0 to B7, respectively. Input channel A0 receives the same input as input channel B0, input channel A1 receives the same input as input channel B1, etc. Thus, the input channels for each of the A/D converters are tied together since they receive the same input.

Each of the output channels, A0 to A7 and B0 to B7 are connected to the High Speed Scheduler. Once the High Speed Scheduler receives the outputs from the A/D converters, the outputs are stored in memory locations in a mailbox. The High Speed Scheduler transmits outputs A0 to A7 and B0 to B7 to memory locations within the mailbox. As illustrated in FIG. 1, each of the outputs correspond to a particular memory location in the mailbox. Outputs for channel 0 are stored in memory location 0, outputs for channel 1 are stored in memory location 1, etc. Thus, outputs for channel A0 and B0 are stored in the same memory location 0, outputs for channel A1 and B1 are stored in the same memory location 1, etc.

In accordance with one embodiment of the present invention, an analog-to-digital signal conversion system includes two or more analog-to-digital converters having equal inherent frequencies. The analog-to-digital converters share common input channels, and the output of each analog-to-digital converter can be directed to the high speed scheduler or a multiplexer that is arranged on a programmable logic device. The converters alternate in sampling of analog signals, thus delivering digital signals to the multiplexer at a higher speed than either analog-to-digital converter could do on an individual basis. The multiplexer delivers the digital signals to slots of a memory mailbox, where the slots correspond to the input channels of each converter.

In accordance with a preferred embodiment, a custom-programmed field programmable gate array may be used to switch between two or more, preferably two, analog-to-digital converter devices. Preferably, each analog-to-digital converter has an inherent frequency of about two megahertz and an eight-bit resolution, although any analog-to-digital converter having any frequency resolution may be utilized. The converters share a common address and data bus in the signal conversion system architecture. The gate array sequences selection, conversion, and reading from the converters together give the appearance and effect of a single, high-speed analog-to-digital converter. Registers may interface with the converters, the gate array, and a processor to determine what input channels each individual converter should read, as well as what speed to perform the readings.

Preferably, the gate array also controls whether sampling occurs in a fixed/real time, or in response to an external factor such as the timing or speed (i.e., cycles) of an internal combustion engine. In the case of engine time, a fixed number of samples is preferably selected, and the engine speed is used to fit that number of samples into an engine period.

As an additional description of a preferred embodiment of the present invention, an analog-to-digital signal conversion system, includes a first analog-to-digital converter having an first inherent frequency, a first output means, and a first plurality of input channels; a second analog-to-digital converter having a second inherent frequency equal to the first inherent frequency, a second output means, and a second plurality of input channels, the second plurality being equal to or greater than the first plurality of input channels; a programmable logic device configured to include a first start-of-conversion output that is operative to direct the first converter to convert a first analog signal to a first digital signal, a second start-of-conversion output operative to direct the second converter to convert a second analog signal to a second digital signal, and a multiplexer operative to receive a first digital signal and the second digital signal and deliver the signals to a memory mailbox.

Optionally, the programmable logic device is further configured to include a sampling rate selector operative to establish a sampling rate for the first start-of-conversion output and the second start-of-conversion output. Also optionally, the programmable logic device may be configured to include a channel selector operative to select a selected channel from the plurality of common input channels, and the selected channel may thus be operative to deliver the first analog signal to the first converter or the second analogy signal to the second converter.

As an additional option, the first plurality of input channels and the second plurality of input channels may comprise a plurality of common input channels. Also optionally, the memory mailbox may comprise a plurality of memory slots, the plurality of memory slots being equal to or greater than the first plurality of input channels.

Further, the channel selector optionally may be further operative to select a selected memory slot from the plurality of memory slots, the selected memory slot corresponding to the selected channel. In addition, the memory mailbox may comprise a plurality of memory slots, the plurality of memory slots being equal or greater than the first plurality of input channels. Also, the programmable logic device may optionally and preferably be a field programmable gate array (FPGA).

As an additional option, the first start-of-conversion output and the second start-of-conversion output may deliver signals that are approximately 180 degrees out of phase with respect to each other.

Figure 2:
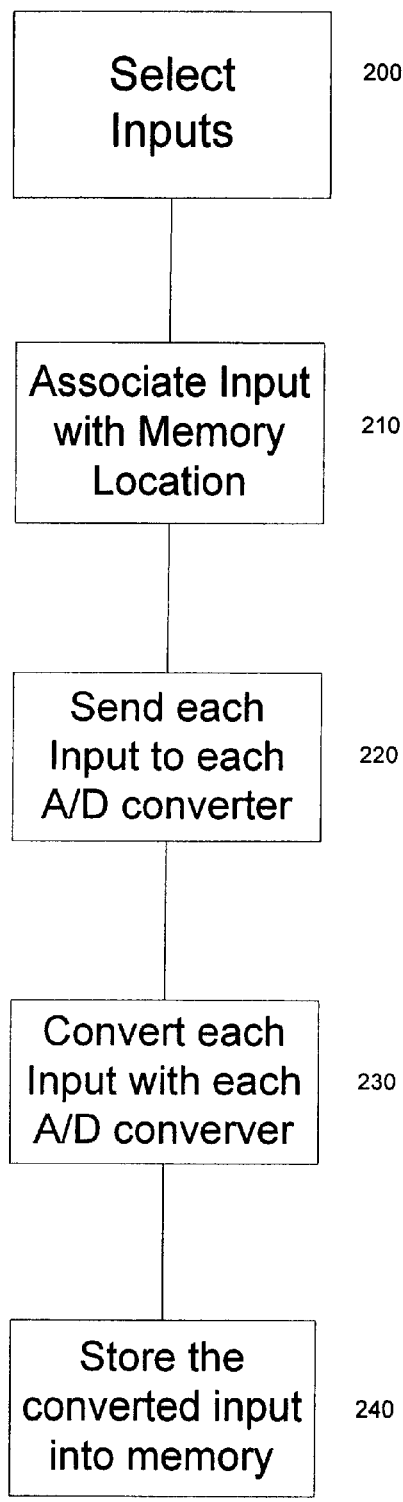
FIG. 2 is a flow diagram showing the method steps of an analog-to-digital conversion system of the present invention.

FIG. 2 is a flow diagram showing the method steps of an analog-to-digital conversion system of the present invention. In step 200 the channels of interest are selected. Thus, a user can select channels 0, 3, 5, and 7 as being channels to be examined. The user can also select the order of the channels. For example, the user can select channels 3, 0, 7 and 5.

In step 210 each of the channels are associated with a memory location within the mailbox. For example as illustrated in FIG. 1, channel 0 is associated with memory location 0, channel 1 is associated with memory location 1, etc. Thus, A0 and B0 are associated with memory location 0, A1 and B1 are associated with memory location 1, etc.

In step 220, each of the input channels is transmitted to each of the A/D converters. For example, input 0 is sent to A0 and B0, input 1 is sent to A1 and B1, etc. In step 230 the inputs are converted from an analog signal to a digital signal through the A/D converters. In step 240, the digital signal is stored into a corresponding memory location. For Example, A0 and B0 are stored in memory location 0, A1 and B1 are stored in memory location 1, etc.

Information can be stored in the memory and read from memory in a variety of ways. In one embodiment of the invention, the memory is simply overwritten as new inputs are received. In another embodiment of the invention, incoming data is compared with the data stored in memory. If the incoming data meets a certain criteria the data stored in memory is overwritten. For example in a peak detection system, if the incoming data is greater than the data stored in memory, the data stored in memory is overwritten by the incoming data.

In another embodiment of the invention, a flag can be used in conjunction with the mailbox to indicate when new data is being stored in memory. For example, each of the memory locations 0–7 can have an associated flag, f0–f7, respectively. If a flag is set, this will indicate that there is new data to be read from the memory location. Thus, if f3 is set, this indicates that memory location 3 has received new incoming data.

The present invention has many applications, such as use in an engine analyzer, where high-speed analog-to-digital conversion is required. Examples of such an engine analyzer are disclosed in U.S. Pat. No. 5,190,892 to Makhija et al., which is incorporated herein by reference in its entirety.

Since numerous modifications and variations will readily occur to those skilled in the art, it is not desired to limit the invention to the exact construction and operation illustrated and described, and accordingly, all suitable modifications and equivalents may be restored to, falling within the scope of the invention.

The many features and advantages of the invention are apparent from the detailed specification, and thus, it is intended by the appended claims to cover all such features and advantages of the invention which fall within the true spirits and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An analog-to-digital conversion system comprising:
    a plurality of analog-to-digital converters receiving inputs that are connected to one another so that each of said analog-to-digital converters receive each of the inputs;
    a scheduler in communication with said plurality of analog-to-digital converters wherein said scheduler selects which of said inputs to transmit; and
    a memory having a plurality of memory locations wherein said scheduler associates each of said inputs to a memory location and transmits said selected input to said associated memory location.

2. The analog-to-digital conversion system as recited in claim 1 wherein each of said plurality of analog-to-digital converters operates out of phase.

3. The analog-to-digital conversion system as recited in claim 1 wherein each of said plurality of analog-to-digital converters operates 180 degrees out of phase.

4. The analog-to-digital conversion system as recited in claim 1 wherein said scheduler coordinates transfer of information from each of said analog-to-digital converters to said memory out of phase.

5. The analog-to-digital conversion system as recited in claim 1 wherein said scheduler coordinates transfer of information from each of said analog-to-digital converters to said memory 180 degrees out of phase.

6. The analog-to-digital conversion system as recited in claim 1 wherein said scheduler coordinates which order said selected outputs are to be transmitted to said memory.

7. An analog-to-digital conversion method comprising the steps of:
    selecting one or more inputs from multiple inputs;
    associating each of said one or more inputs with a corresponding memory location;
    transmitting each of said one or more inputs to multiple analog-to-digital converters;
    converting each of said one or more inputs into a digital signal with each of said multiple analog-to-digital converters; and
    storing each of said digital signals into said corresponding memory location.

8. The method as recited in claim 7 wherein each of said plurality of analog-to-digital converters operates out of phase with one another.

9. The method as recited in claim 7 wherein each of said plurality of analog-to-digital converters operates 180 degrees out of phase with one another.

10. The method as recited in claim 7 wherein said digital signal is stored in said corresponding memory location out of phase with a digital signal from another analog-to-digital converter that corresponds to the same corresponding memory location.

11. The method as recited in claim 7 wherein said digital signal is stored in said corresponding memory location 180 degrees out of phase with said digital signal from another analog-to-digital converter that corresponds to the same corresponding memory location.

12. The method as recited in claim 7 further comprising the step of selecting which of said digital signals are stored in said corresponding memory locations.

13. The method as recited in claim 7 wherein said digital data is stored in said corresponding memory location if previous digital data stored in said corresponding memory location is smaller than said digital data.

14. An analog-to-digital conversion system comprising:
    a selecting means for selecting one or more inputs from multiple inputs;
    an associating means for associating each of said one or more inputs with a corresponding memory location;
    a transmitting means for transmitting each of said one or more inputs to multiple analog-to-digital converters;
    a converting means for converting each of said one or more inputs into a digital signal with each of said multiple analog-to-digital converters; and
    a storing means for storing each of said digital signals into said corresponding memory location.

15. The system as recited in claim 14 further comprising a means for operating each of said plurality of analog-to-digital converters out of phase with one another.

16. The system as recited in claim 14 further comprising a means for operating each of said plurality of analog-to-digital converters 180 degrees out of phase with one another.

17. The system as recited in claim 14 further comprising a means for storing said digital signal in said corresponding memory location out of phase with a digital signal from another analog-to-digital converter that corresponds to the same corresponding memory location.

18. The system as recited in claim 14 further comprising a means for storing said digital signal in said corresponding memory location 180 degrees out of phase with a digital signal from another analog-to-digital converter that corresponds to the same corresponding memory location.

19. The system as recited in claim 14 further comprising a selecting means for selecting which of said digital signals are stored in said corresponding memory locations.

20. The system as recited in claim 14 further comprising a means for storing said digital data in said corresponding memory location if previous digital data stored in said corresponding memory location is smaller than said digital data.

* * * * *